United States Patent
Lee

(10) Patent No.: US 11,271,156 B2
(45) Date of Patent: Mar. 8, 2022

(54) ELECTRONIC DEVICE AND METHOD FOR FABRICATING THE SAME

(71) Applicant: SK hynix Inc., Icheon (KR)

(72) Inventor: Hyung Suk Lee, Icheon (KR)

(73) Assignee: SK hynix Inc., Icheon (KR)

( * ) Notice: Subject to any disclaimer, the term of this patent is extended or adjusted under 35 U.S.C. 154(b) by 144 days.

(21) Appl. No.: 16/407,845

(22) Filed: May 9, 2019

(65) Prior Publication Data

US 2020/0066988 A1 Feb. 27, 2020

(30) Foreign Application Priority Data

Aug. 23, 2018 (KR) .................... 10-2018-0098546

(51) Int. Cl.
| | | |
|---|---|---|
| *H01L 27/24* | (2006.01) | |
| *H01L 45/00* | (2006.01) | |
| *H01L 21/02* | (2006.01) | |

(52) U.S. Cl.
CPC ...... *H01L 45/165* (2013.01); *H01L 21/02417* (2013.01); *H01L 21/02568* (2013.01); *H01L 27/2427* (2013.01); *H01L 27/2463* (2013.01); *H01L 45/06* (2013.01); *H01L 45/1253* (2013.01); *H01L 45/144* (2013.01)

(58) Field of Classification Search
CPC ............ H01L 45/165; H01L 21/02417; H01L 21/02568; H01L 27/2463; H01L 45/144; H01L 45/06; H01L 45/1253; H01L 27/2427; H01L 45/148; H01L 27/224; H01L 27/2409; H01L 45/04; H01L 45/146; H01L 45/147; H01L 45/143; H01L 45/1233; H01L 45/1641; H01L 45/12

See application file for complete search history.

(56) References Cited

U.S. PATENT DOCUMENTS

| | | | | |
|---|---|---|---|---|
| 5,712,496 | A * | 1/1998 | Takahashi | .......... H01L 29/6675 257/64 |
| 7,141,482 | B1 * | 11/2006 | Avanzino | .......... G11C 13/0009 438/387 |
| 7,550,756 | B2 | 6/2009 | Asano et al. | |
| 9,570,677 | B2 | 2/2017 | Redaelli et al. | |
| 2006/0221555 | A1 * | 10/2006 | Pinnow | ................. H01L 45/143 361/525 |
| 2007/0090336 | A1 * | 4/2007 | Asano | ................. H01L 27/2472 257/3 |
| 2007/0170413 | A1 * | 7/2007 | Matsui | ............... H01L 45/1233 257/3 |
| 2010/0213535 | A1 * | 8/2010 | Kathawala | ....... H01L 27/11578 257/324 |

(Continued)

OTHER PUBLICATIONS

Pengfei Guo, A Review of Germanium-Antimony-Telluride Phase Change Materials for Non-Volatile Memories and Optical Modulators, Feb. 2019, pp. 1-26. (Year: 2019).*

(Continued)

*Primary Examiner* — S M Sohel Imtiaz

(57) ABSTRACT

A method for fabricating an electronic device including a semiconductor memory includes forming a chalcogenide layer, forming a first conductive layer on the chalcogenide layer, and increasing a density of an interface between the chalcogenide layer and the first conductive layer by injecting or irradiating ions onto the interface.

20 Claims, 10 Drawing Sheets

(56) References Cited

U.S. PATENT DOCUMENTS

| | | | |
|---|---|---|---|
| 2011/0297910 A1* | 12/2011 | Dahmani | C23C 14/024 257/2 |
| 2012/0267595 A1* | 10/2012 | Fang | H01L 45/142 257/2 |
| 2016/0172587 A1* | 6/2016 | Redaelli | H01L 45/06 257/4 |
| 2017/0186812 A1* | 6/2017 | Lee | H01L 27/1159 |
| 2017/0186813 A1* | 6/2017 | Kim | H01L 45/04 |
| 2017/0244026 A1* | 8/2017 | Wu | H01L 45/126 |

OTHER PUBLICATIONS

Wong et al., "Phase Change Memory," Proceedings of the IEEE, Dec. 2010, pp. 2201-2227, vol. 98, No. 12.

* cited by examiner

ELECTRONIC DEVICE AND METHOD FOR FABRICATING THE SAME

CROSS-REFERENCE TO RELATED APPLICATION

The present application claims priority under 35 U.S.C. § 119(a) to Korean patent application number 10-2018-0098546, filed on Aug. 23, 2018, the entire disclosure of which is herein incorporated by reference in its entirety.

BACKGROUND

Field of Invention

Various embodiments of the present disclosure relate to a memory circuit or device, and an application thereof in an electronic device.

Description of Related Art

Recently, in response to requirements for miniaturization, low power consumption, high performance, and diversification of electronic devices, semiconductor devices capable of storing information have been in demand in various electronic devices such as computers and portable communication devices. Therefore, there has been research on semiconductor devices that store data using switching characteristics between different resistance states depending on the applied voltage or current. Examples of such semiconductor devices may include a resistive random access memory (RRAM), a phase-change random access memory (PRAM), a ferroelectric random access memory (FRAM), a magnetic random access memory (MRAM), and an E-fuse.

SUMMARY

Various embodiments of the present disclosure are directed to an electronic device provided with memory cells having improved operating characteristics and reliability, and a method for fabricating the electronic device. An embodiment of the present disclosure may provide a method for fabricating an electronic device including a semiconductor memory, the method including forming a chalcogenide layer, forming a first conductive layer on the chalcogenide layer, and increasing a density of an interface between the chalcogenide layer and the first conductive layer by injecting or irradiating ions onto the interface.

An embodiment of the present disclosure may provide a method for fabricating an electronic device including a semiconductor memory, the method including forming a chalcogenide layer, forming a conductive layer on the chalcogenide layer, and modifying an interface between the chalcogenide layer and the conductive layer by mixing a material of the chalcogenide layer with a material of the conductive layer at the interface.

An embodiment of the present disclosure may provide an electronic device including a semiconductor memory, the semiconductor memory including a variable resistance layer, and an electrode on the variable resistance layer, wherein the variable resistance layer includes an interface region adjacent to an interface between the variable resistance layer and the electrode, and a void region located under the interface region, and the interface region has a higher density than the void region.

An embodiment of the present disclosure may provide an electronic device including a semiconductor memory, the semiconductor memory including a variable resistance layer including a void region and a core region located under the void region and having a higher density than the void region, an electrode on the variable resistance layer, and an interface layer interposed between the variable resistance layer and the electrode and having a higher density than the void region.

DETAILED DESCRIPTION

Figure 1A:
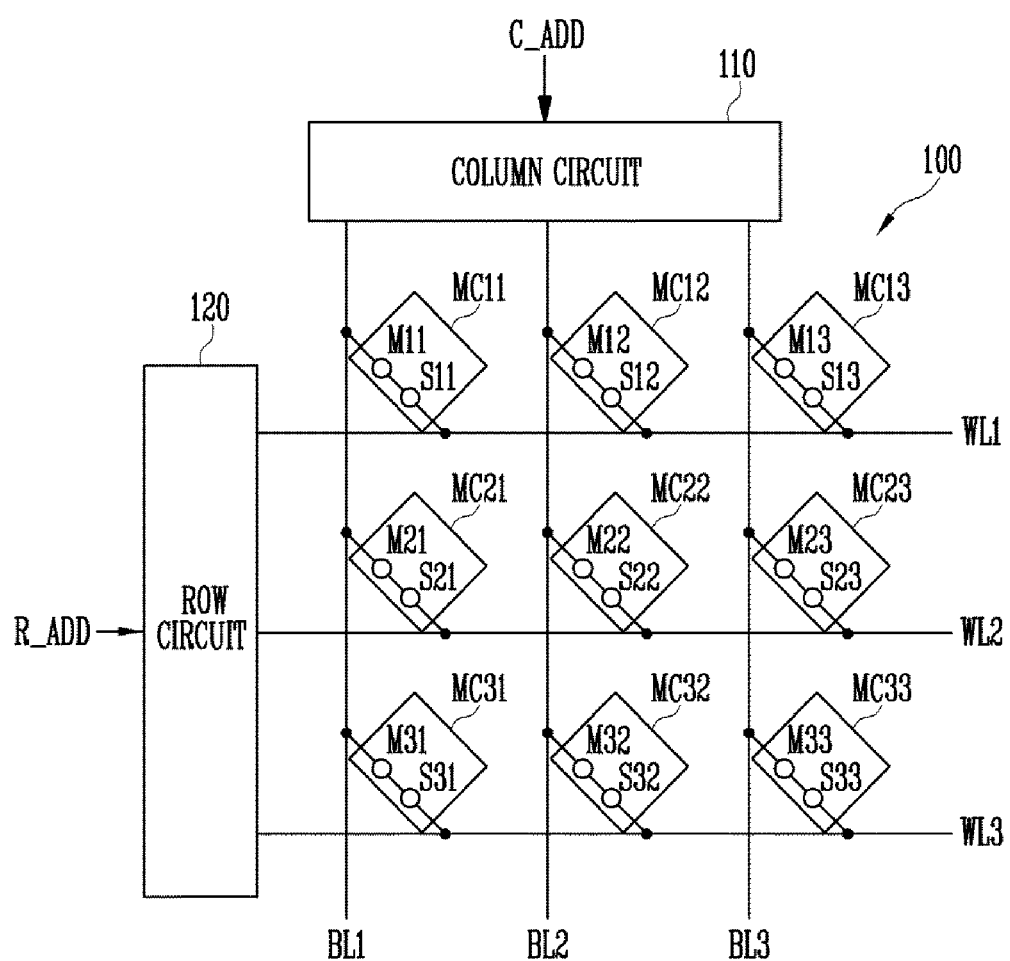
FIGS. 1A and 1B are diagrams illustrating the structure of an electronic device according to an embodiment of the present disclosure.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, for fabricating techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Figure 1B:
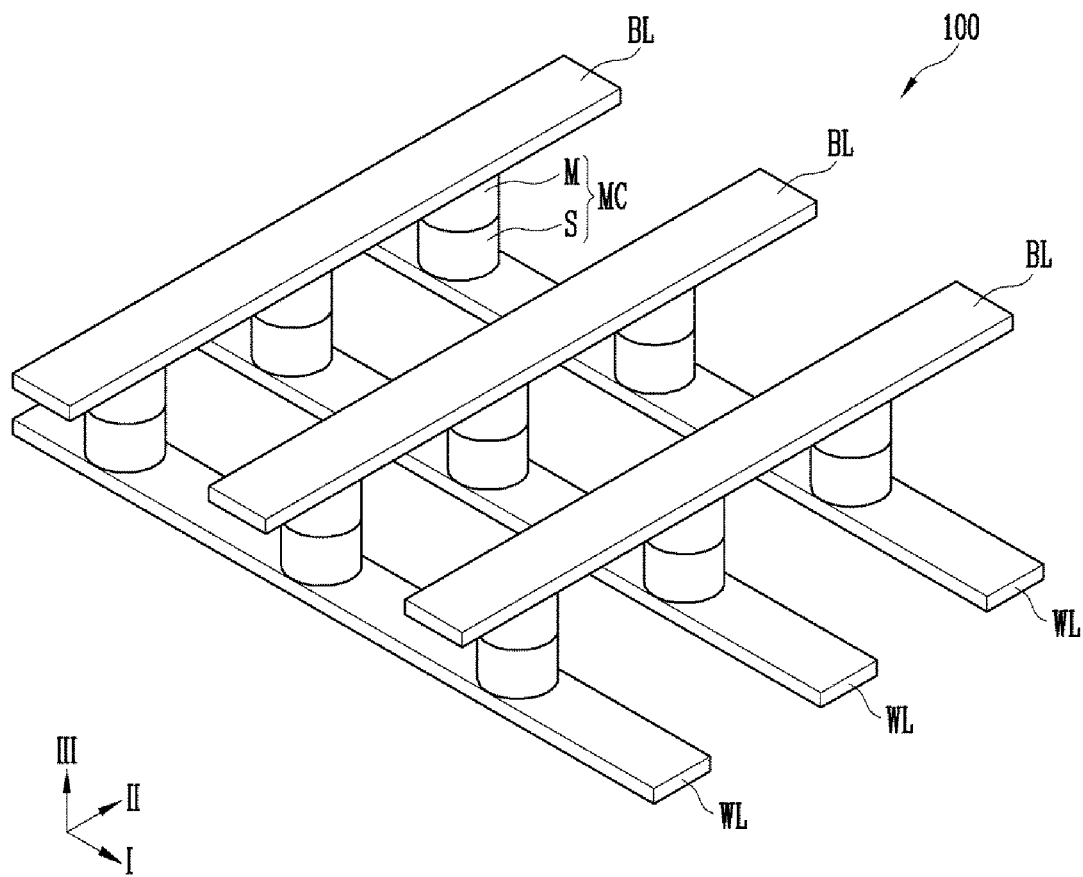

FIGS. 1A and 1B are diagrams illustrating the structure of an electronic device according to an embodiment of the present disclosure. FIG. 1A is a circuit diagram of a memory cell array 100. FIG. 1B is a perspective view of the memory cell array 100.

Referring to FIG. 1A, an electronic device according to an embodiment of the present disclosure may include a semiconductor memory. The semiconductor memory may include row lines, and column lines crossing the row lines. The row lines may be word lines and the column lines may be bit lines. For reference, the terms "word lines" and "bit lines" may be relative to each other. In other words, row lines may be bit lines, and column lines may be word lines. Hereinafter, a description will be made on the assumption that row lines are word lines and column lines are bit lines.

The memory cell array 100 may include memory cells MC11 to MC33 respectively disposed between column lines BL1 to BL3 and row lines WL1 to WL3. The memory cells MC11 to MC33 may be disposed at respective intersections between the column lines BL1 to BL3 and the row lines WL1 to WL3. The memory cells MC11 to MC33 may include select devices S11 to S33 and memory devices M11 to M33 coupled in series to each other, respectively. Each of the select devices S11 to S33 may be electrically coupled to a corresponding one of the row lines WL1 to WL3. Each of the memory devices M11 to M33 may be electrically coupled to a corresponding one of the column lines BL1 to BL3.

Each of the memory devices M11 to M33 may include a memory pattern as a storage node for storing data. For example, the memory devices M11 to M33 may include a resistive material, a magnetic tunnel junction (MTJ), or a variable resistance material such as a phase change material. The select devices S11 to S33 may be configured to select the memory cells MC and include a switching material. Each of the select devices S11 to S33 may be a diode, a PNP diode, a BJT, a metal insulator transition (MIT) device, a mixed ionic-electronic conduction (MIEC) device, an ovonic threshold switching (OTS) device, or the like.

The shape and the configuration of each of the memory cells MC11 to MC33 may vary. For example, the select devices S11 to S33 may be removed, or the select devices S11 to S33 and the memory devices M11 to M33 may change locations with each other. In other words, each of the select devices S11 to S33 may be electrically coupled to a corresponding one of the column lines BL1 to BL3 and the memory devices M11 to M33 may be electrically coupled to a corresponding one of the row lines WL1 to WL3.

In addition, the semiconductor memory may further include a column circuit 110 configured to control the column lines BL1 to BL3, and a row circuit 120 configured to control the row lines WL1 to WL3.

The row circuit 120 may be a row decoder, a word line decoder, a word line driver, or the like. The row circuit 120 may select the row line WL2, among the row lines WL1 to WL3, by a row address R_ADD. The column circuit 110 may be a column decoder, a bit line decoder, a bit line driver, or the like. The column circuit 110 may select the column line BL2, among the column lines BL1 to BL3, by a column address C_ADD. Therefore, a memory cell MC22 coupled between the selected column line BL2 and the selected row line WL2 may be selected.

FIG. 1A illustrates an embodiment where the three column lines BL1 to BL3 and the three row lines WL1 to WL3 are provided. However, this is only for the sake of description and the present disclosure is not limited thereto. The number of column lines BL1 to BL3 or the row lines WL1 to WL3 included in the memory cell array 100 may be changed as needed.

Referring to FIG. 1B, the memory cell array 100 may include the column lines BL and the row lines WL located at different levels. For example, the column lines BL may be disposed above the row lines WL. In addition, the row lines WL may extend in a first direction I, and the column lines BL may extend in a second direction II crossing the first direction I.

The memory cells MC may be disposed at intersections between the column lines BL and the row lines WL and arranged in a matrix format. In addition, each of the memory cells MC may be a memory stack and include a memory device M and a select device S stacked in a third direction III. The third direction III may cross and be perpendicular to the first direction I and the second direction II.

In addition, as illustrated in FIG. 1B, the memory cell array may have a single deck structure. However, the invention is not limited thereto. The memory cells MC may be stacked in the third direction III. For example, the memory cell array may have a multi-deck structure in which the row lines WL and the column lines BL are stacked alternately with each other in the third direction III. In the multi-deck structure, the memory cells MC may be located between the row lines WL and the column lines BL that are stacked alternately with each other.

By the above-described structure, the memory cells MC may be arranged in a cross-point structure, so that integration density of the memory device may be improved. In addition, by stacking the memory cells MC in the multi-deck structure, integration density of the memory device may be further improved.

Figure 2A:
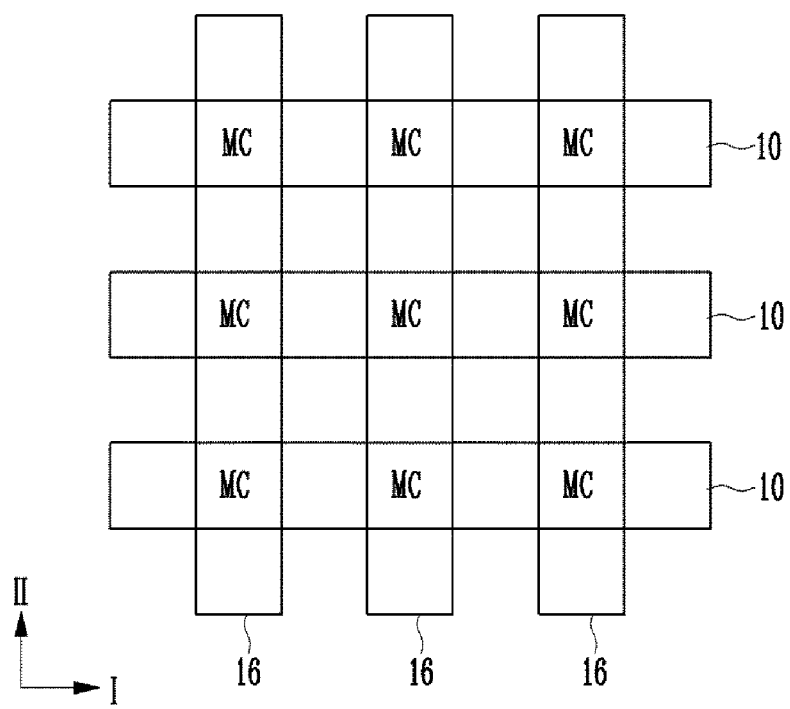
FIGS. 2A to 2C are diagrams illustrating the structure of an electronic device according to an embodiment of the present disclosure.
Figure 2B:
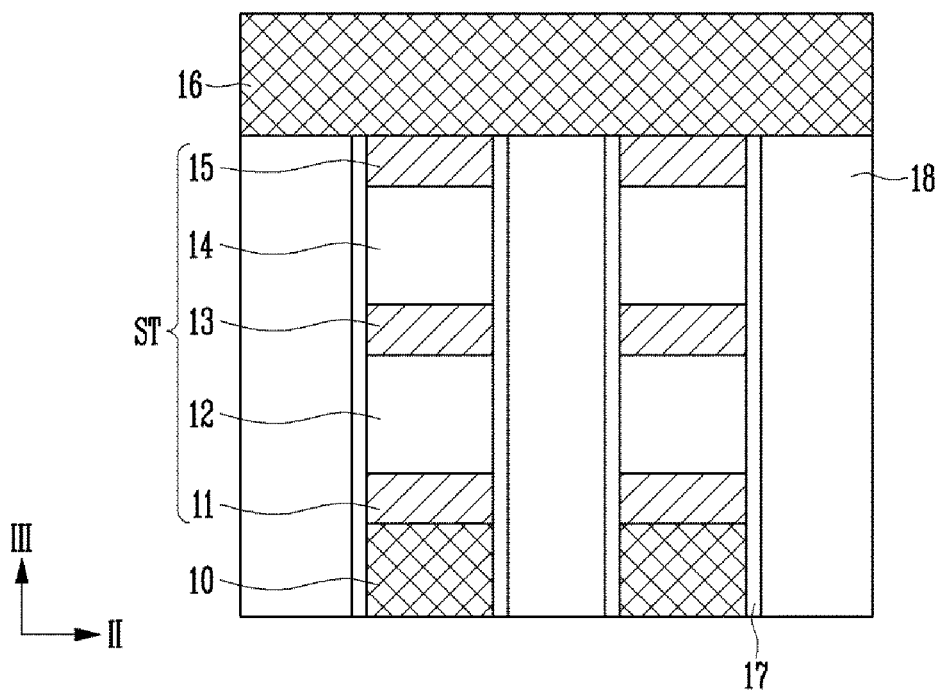
Figure 2C:
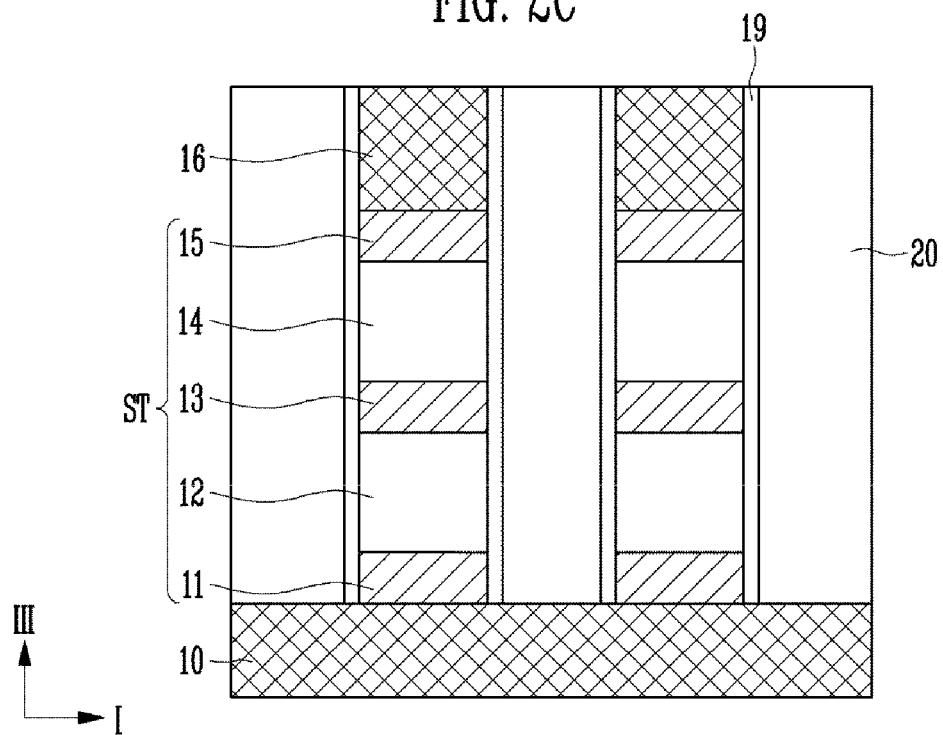

FIGS. 2A to 2C are diagrams illustrating the structure of an electronic device according to an embodiment of the present disclosure. FIG. 2A is a layout view, FIG. 2B is a cross-sectional view of FIG. 2A in the second direction II, and FIG. 2C is a cross-sectional view of FIG. 2A in the first direction I.

Referring to FIGS. 2A to 2C, the memory cells MC may include stacked structures ST, which may be located at intersections between row lines 10 and column lines 16. In addition, protective layers 17 and 19 may be formed on sidewalls of the stacked structures ST, and insulating layers 18 and 20 may fill gaps between the stacked structures ST.

Each of the stacked structures ST may include a lower electrode 11, a switching layer 12, an intermediate electrode 13, a variable resistance layer 14, and an upper electrode 15 which are sequentially stacked.

The variable resistance layer 14 may reversibly transition between different resistance states depending on a voltage or current being applied. Therefore, when the variable resistance layer 14 has a low resistance state, data of '1' may be stored. On the other hand, when the variable resistance layer 14 has a high resistance state, data of '0' may be stored.

When the variable resistance layer 14 includes a low resistance material, the variable resistance layer 14 may include a transition metal oxide, or a metal oxide such as a perovskite-based material. Therefore, as an electrical path is present or absent in the variable resistance layer 14, data may be stored accordingly.

When the variable resistance layer 14 has an MTJ structure, the variable resistance layer 14 may include a magnetization fixed layer, a magnetization free layer, and a tunnel barrier layer interposed therebetween. For example, the magnetization fixed layer and the magnetization free layer may include a magnetic material, and the tunnel barrier layer may include an oxide such as magnesium (Mg), aluminum (Al), zinc (Zn), or titanium (Ti). A magnetization direction of the magnetization free layer may be changed by spin torque of electrons in the applied current. Therefore, data may be stored depending on changes in magnetization direction of the magnetization free layer with respect to the magnetization direction of the magnetization fixed layer.

When the variable resistance layer 14 includes a phase change material, the variable resistance layer 14 may include a chalcogenide-based material. More specifically, the variable resistance layer 14 may include silicon (Si), germanium (Ge), antimony (Sb), tellurium (Te), bismuth (Bi), indium (In), tin (Sn), selenium (Se), or a combination thereof as the chalcogenide-based material. For example, the variable resistance layer 14 may be a Ge—Sb—Te (GST) material, such as $Ge_2Sb_2Te_5$, $Ge_2Sb_2Te_7$, $Ge_1Sb_2Te_4$, and $Ge_1Sb_4Te_7$. A chemical composition ratio of the variable resistance layer 14 may be determined depending on characteristics of a melting point and crystallization temperature. The variable resistance layer 14 may further include carbon (C) or nitrogen (N). The phase change material may have low-resistance characteristics when in a crystalline state and high-resistance characteristics when in an amorphous state. Therefore, data may be stored by a set operation in which an amorphous state with high resistance is switched to a crystalline state with low resistance, and a reset operation in which a crystalline state with low resistance is switched into an amorphous state with high resistance.

The switching layer 12 may be a select device that controls a flow of current according to a value of the applied voltage or current. Therefore, when the value of the applied voltage or current is less than a predetermined threshold value, the switching layer 12 may flow little current. When the value of the applied voltage or current exceeds the predetermined threshold value, current may flow through the switching layer 12 at a level that is drastically increased relative to an amount of current that flows through the switching layer 12 when the current or voltage is below the threshold value.

When the switching layer 12 is a metal insulator transition (MIT) device, the switching layer 12 may include $VO_2$, $NbO_2$, $TiO_2$, $WO_2$, $TiO_2$, or the like. When the switching layer 12 is a mixed ion-electron conducting (MIEC) device, the switching layer 12 may include $ZrO_2(Y_2O_3)$, $Bi_2O_3$—BaO, $(La_2O_3)_x(CeO_2)_{1-x}$, or the like. In addition, when the switching layer 12 is an ovonic threshold switching (OTS) device, the switching layer 12 may include a chalcogenide-based material such as $As_2Te_3$, $As_2$, or $As_2Se_3$.

The lower electrode 11 may be electrically coupled to the row lines 10, the intermediate electrode 13 may be interposed between the switching layer 12 and the variable resistance layer 14, and the upper electrode 15 may be electrically coupled to the column lines 16. The lower electrode 11, the intermediate electrode 13, and the upper electrode 15 may include a conductive material such as metal or metal nitrides. For example, each of the lower electrode 11, the intermediate electrode 13 and the upper electrode 15 may include tungsten (W), tungsten nitride (WN), tungsten silicide (WSi), titanium (Ti), titanium nitride ($TiN_x$), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn) Cobalt (Co), lead (Pd), platinum (Pt), or a combination thereof.

Each of the lower electrode 11, the intermediate electrode 13, and the upper electrode 15 may have a single layer structure or a multi-layer structure. When each of the lower electrode 11, the intermediate electrode 13, and the upper electrode 15 has the multi-layer structure, an interface electrode contacting the variable resistance layer 14 or the switching layer 12 may be included. In addition, the lower electrode 11, the intermediate electrode 13 and the upper electrode 15 may have the same or different thicknesses. However, the shape and configuration of the stacked structure ST may vary. For example, at least one of the lower electrode 11, the intermediate electrode 13, and the upper electrode 15 may be removed.

In addition, to improve characteristics or processes of the memory cell MC, interfaces between the layers (11 to 15) included in the stacked structure ST may be modified, or at least one layer may be added to each of the interfaces. For example, an interface between the upper electrode 15 and the variable resistance layer 14 or an interface between the intermediate electrode 13 and the switching layer 12 may be modified, or an interface layer may be added to the interface. As a result, the variable resistance layer 14 or the switching layer 12 may have a density that varies according to the third direction III. For example, the variable resistance layer 14 may have a relatively high density and include a void or a defect at an interface region adjacent to the interface between the variable resistance layer 14 and the upper electrode 15. In another example, the switching layer 12 may have a relatively high density and include a void or a defect at an interface region adjacent to the interface between the switching layer 12 and the intermediate electrode 13.

The protective layers 17 and 19 may protect the stacked structures ST during manufacturing processes, and may be formed on sidewalls of the stacked structures ST. The protective layer 17 may cover opposing sidewalls of a stacked structure ST in the second direction II, and may extend in the first direction I. The protective layer 19 may cover opposing sidewalls of the stacked structure ST in the first direction I, and may extend in the second direction II. The protective layers 17 and 19 may include a non-conductive material such as an oxide, a nitride, polysilicon, or the like. For example, the protective layers 17 and 19 may include silicon oxide ($SiO_x$), silicon nitride ($Si_3N_4$), polysilicon, titanium nitride (TiN), tantalum nitride (TaN), or a combination thereof. In addition, the protective layer 17 may be a single layer or a multilayer structure.

In addition, the insulating layers 18 and 20 may be formed between neighboring stacked structures ST and fill space between the neighboring stacked structures ST. The insulating layer 18 may fill a gap between neighboring stacked structures ST in the second direction II, and the insulating layer 20 may fill a gap between neighboring stacked structures ST in the first direction I. For example, the insulating layer 18 may include an oxide such as silicon oxide $SiO_2$, or a flowable oxide layer such as a spin on coating (SOC) layer, a spin on dielectric (SOD) layer, or a combination thereof.

By the above-described structure, the memory cells MC may be arranged in a cross-point structure, so that the integration density of the memory device may be improved. In addition, the interface between the upper electrode 15 and the variable resistance layer 14 or the interface between the intermediate electrode 13 and the switching layer 12 may be modified, or the interface layer may be added to the interface, so that degradation of the characteristics of the memory device may be prevented.

Figure 3A:
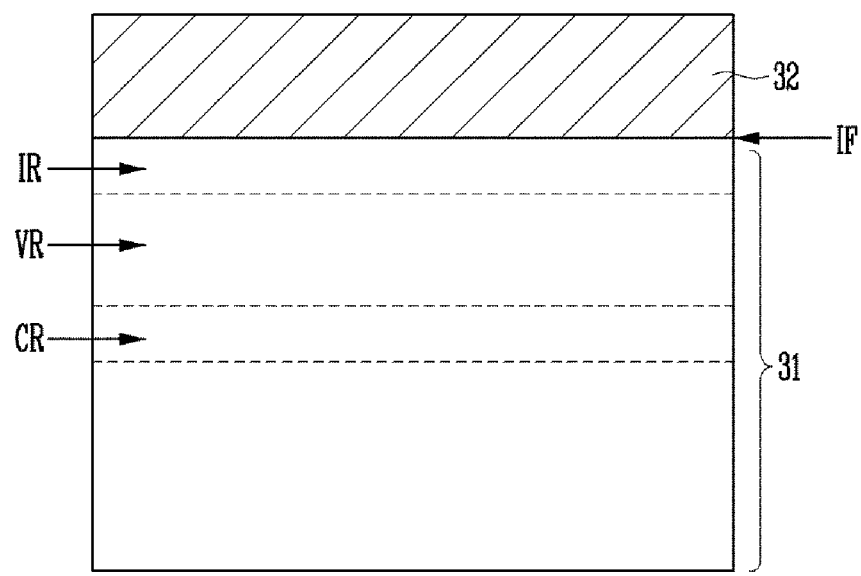
FIGS. 3A to 3C are diagrams illustrating the structure of an electronic device including a semiconductor memory according to an embodiment of the present disclosure.
Figure 3B:
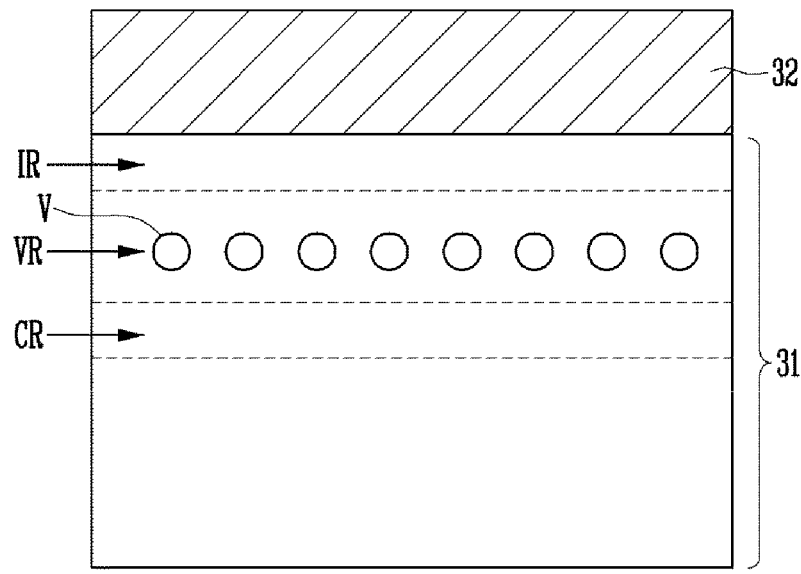
Figure 3C:
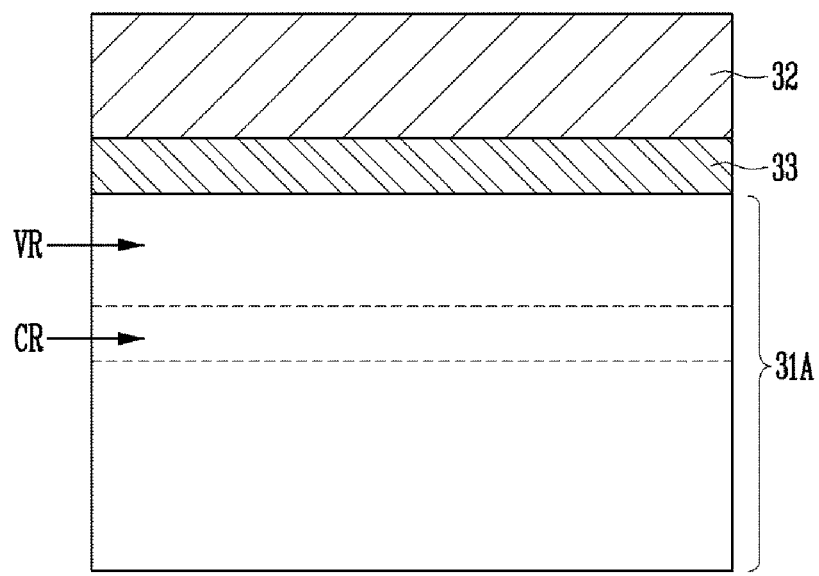

FIGS. 3A to 3C are cross-sectional diagrams illustrating the structure of an electronic device including a semiconductor memory in accordance with an embodiment of the present disclosure.

Referring to FIGS. 3A to 3C, an electronic device according to an embodiment of the present disclosure may include a semiconductor memory, and the semiconductor memory may include chalcogenide layers 31 and 31A and a conductive layer 32. Each of the chalcogenide layers 31 and 31A may be a variable resistance layer or a switching layer. The conductive layer 32 may be an electrode or an interface electrode.

Referring to FIGS. 3A and 3B, the chalcogenide layer 31 may include an interface region IR, a void region VR, and a core region CR. The core region CR may correspond to the center of the chalcogenide layer 31, and the interface region IR may be adjacent to an interface IF between the chalcogenide layer 31 and the conductive layer 32. In other words, the interface region IR may be located between the core region CR and the interface IF and the interface region IR may contact the interface IF. In addition, the void region VR may be located between the interface region IR and the core region CR and contact the interface region IR. In other words, the void region VR may be located under the interface region IR.

The interface region IR, the void region VR and the core region CR may have different densities. The interface region IR may include a higher content of an element with a relative large atomic weight and be a high-density region. The void region VR may include a void or a defect and be a low-density region. The core region CR may have substantially the same density as or a lower density than the interface region IR. For example, the interface region IR may have a higher density than the void region VR, or a higher density than both the void region VR and the core region CR. In addition, the void region VR may have a lower density than the interface region IR, or a lower density than both the interface region IR and the core region CR.

The interface region IR may be formed by irradiating or injecting ion beams into the interface IF. Therefore, the interface region IR may refer to a region where the material of the chalcogenide layer 31 and the material of the conductive layer 32 are mixed together. In addition, a content of one or more elements in the interface region IR may be higher than a concentration of such elements in the void region VR, or concentrations in both the void region VR and the core region CR. For example, an element having a relatively large atomic weight may be present in a high concentration in the chalcogenide layer 31. More specifically, the chalcogenide layer 31 may have a high content of antimony (Sb) or tellurium (Te).

In addition, the interface region IR may include ions irradiated or injected to modify the interface IF. For example, the interface region IR may include ions of, for example, germanium (Ge), arsenic (As), phosphorous (P), helium (He), boron (B), or carbon (C).

The void region VR may include a void V or a defect. The void V or the defect may occur when the conductive layer 32 is formed on the chalcogenide layer 31. In addition, the void V or the defect may move from the interface IF to the void region VR as the interface IF is modified. Since the void region VR includes the defect or the void V, the void region VR may have a lower density than the interface region IR, or a lower density than both the interface region IR and the core region CR.

FIG. 3A shows a cross section of an electronic device immediately after it has been manufactured, or an electronic device that has not performed a substantial number of write cycles. FIG. 3B shows a cross section of an electronic device that has performed substantially more write cycles than the device of FIG. 3A. Referring to FIG. 3A, the electronic device may include a defect in the void region VR, but not have any voids. However, when set/reset operations are repeated, i.e., as a number of write operations increases, defects in the void region VR may grow into a void V (see FIG. 3B). Alternatively, when a void V is formed during the manufacturing process and write operations are performed, the size and/or number of voids V may increase.

When a void V is present at the interface IF, the chalcogenide layer 31 and the conductive layer 32 may be separated from each other as the number of write operations increases. In other words, a failure may occur due to segregation between the variable resistance layer and the electrode. However, according to an embodiment of the present disclosure, by modifying the interface IF, the defect or the void V may move away from the interface IF or the interface region IR. In other words, the interface region IR may have a dense structure, and a defect or the voids V may be present in the void region VR. Therefore, even when the number of write cycles increases, adhesion between the chalcogenide layer 31 and the conductive layer 32 may be maintained.

Referring to FIG. 3C, a high-density interface layer 33 may be interposed between the chalcogenide layer 31A and the conductive layer 32. The chalcogenide layer 31A may include the void region VR and the core region CR. The void region VR may include a void or a defect and have a lower density than the core region CR.

The interface layer 33 may have a higher density than the void region VR, or a higher density than both the void region VR and the core region CR. For example, the interface layer 33 may have a composition where the material of the chalcogenide layer 31A and the material of the conductive layer 32 are mixed together. In addition, in comparison with the chalcogenide layer 31A, the interface layer 33 may contain a predetermined element at a higher content than other elements in the chalcogenide layer. For example, the chalcogenide layer 31A may contain a higher content of antimony (Sb) or tellurium (Te) having a larger atomic weight than other elements in the chalcogenide layer 31A. Therefore, the adhesion between the chalcogenide layer 31A and the conductive layer 32 may be increased by the interface layer 33.

In the above-described structure, by increasing the density of the interface IF or the interface region IR, or forming the interface layer 33, a void or a defect at the interface IF may move into the chalcogenide layer 31 or 31A. Therefore, adhesion between the chalcogenide layer 31 or 31A and the conductive layer 32 may be increased.

Figure 4A:
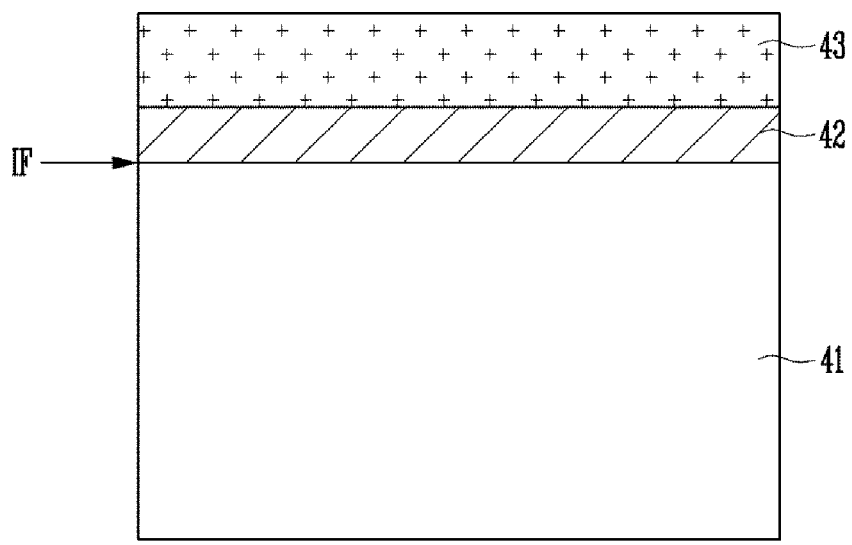
FIGS. 4A to 4C are diagrams illustrating the structure of an electronic device including a semiconductor memory according to an embodiment of the present disclosure.
Figure 4B:
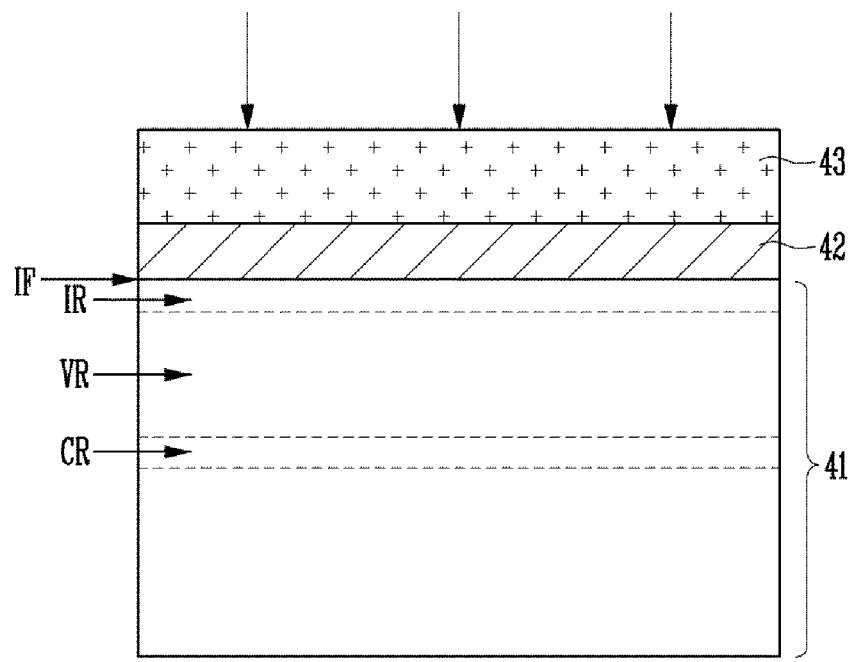
Figure 4C:
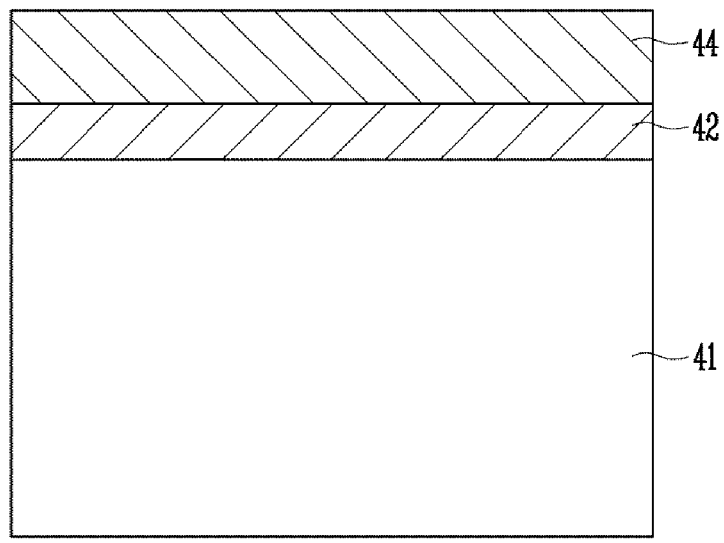

FIGS. 4A to 4C are cross-sectional diagrams illustrating a method for fabricating an electronic device including a semiconductor memory according to an embodiment of the present disclosure.

Referring to FIG. 4A, a first conductive layer 42 may be formed on a chalcogenide layer 41. The chalcogenide layer 41 may be a variable resistance layer or a switching layer. The first conductive layer 42 may be an electrode or an interface electrode and include a conductive material such as tungsten or tungsten nitride.

The first conductive layer 42 may be formed using a deposition method such as chemical vapor deposition (CVD) or physical vapor deposition (PVD). However, when a deposition method is used, the surface of the chalcogenide layer 41, or the interface IF between the chalcogenide layer 41 and the first conductive layer 42 may be damaged. For example, the surface or the interface IF may be damaged by plasma or impurity incorporation. As a result, a void or a defect may occur. A defect may grow into a void as the number of write cycles of the memory device increases. However, since the interface IF is a boundary between different kinds of layers, when a void or a defect exists in the interface IF, the chalcogenide layer 41 and the first conductive layer 42 may be separated from each other to cause a failure. Therefore, according to an embodiment of the present disclosure, the interface IF may be modified to move defects or voids away from the interface IF.

Prior to a modifying process, a protective layer 43 may be formed on the first conductive layer 42. The protective layer 43 may be formed to prevent damage to the first conductive layer 42 and the chalcogenide layer 41 during the modifying process. The protective layer 43 may include an oxide or a nitride. For example, the protective layer 43 may include silicon oxide ($SiO_2$) or silicon nitride ($Si_3N_4$). In addition, the protective layer 43 may have a thickness of 1 to 10 nm.

Referring to FIG. 4B, the interface IF between the chalcogenide layer 41 and the first conductive layer 42 may be modified. By increasing the density of the interface IF by irradiating ions onto the interface IF, a void or a defect on the interface IF may move into the chalcogenide layer 41. As a result, the density of the interface region IR of the chalcogenide layer 41 adjacent to the interface IF may be increased. In addition, the void or the defect on the interface IF may move to the void region VR of the chalcogenide layer 41, and the density of the void region VR may decrease.

The interface IF may be modified by an ion beam irradiation method or an ion beam injection method. When ions are injected into the interface IF, ion beam mixing may be caused so that the material of the chalcogenide layer 41 and the material of the first conductive layer 42 are mixed to thereby increase and the density of the interface region IR. For example, an element with a large atomic weight, such as antimony (Sb) or tellurium (Te), relative to other elements included in the chalcogenide layer 41, may migrate to the interface IF. The migrated element may be mixed with the material of the first conductive layer 42, whereby the density of the interface IF or the interface region IR may increase. In addition, the content of the antimony (Sb) or tellurium (Te) in the interface region IR may be higher than the content of antimony (Sb) or tellurium (Te) in the void region VR or the void region VR and the core region CR.

During an ion beam irradiation or injection process, any element in the periodic table may be used. For example, ion beams may be irradiated using elements such as germanium (Ge), arsenic (As), phosphorous (P), helium (He), boron (B), and carbon (C). In addition, ions may be injected using ion doping equipment. Ions may be irradiated at a concentration of 1E13~1E17 dose/$cm^3$ by using an acceleration voltage of a few or tens of keV.

Subsequently, the interface IF into which ions are irradiated or injected may be thermally treated. For example, thermal treatment may be performed at a temperature of 200 to 400° C. for tens of seconds or tens of minutes. In addition, thermal treatment may be performed at an $N_2$ atmosphere.

Referring to FIG. 4C, the protective layer 43 may be removed. The protective layer 43 may be removed using a cleaning process, for example, a wet or dry cleaning process. A second conductive layer 44 may be formed on the first conductive layer 42. The second conductive layer 44 may serve as an electrode together with the first conductive layer 42 and may include the same or different materials from the first conductive layer 42. In an embodiment, the second conductive layer 44 may include carbon.

According to the above-described processes, by modifying the interface IF between the chalcogenide layer 41 and the first conductive layer 42, the density of the interface IF or the interface region IR may increase. Therefore, the void or the defect on the interface IF may move into the chalcogenide layer 41 and adhesion between the chalcogenide layer 41 and the first conductive layer 42 may be improved. In addition, even when a defect grows into a void or the size of the void increases with an increasing number of write cycles, segregation between the electrode and the variable resistance layer or the switching layer caused by the void may be avoided.

Figure 5A:
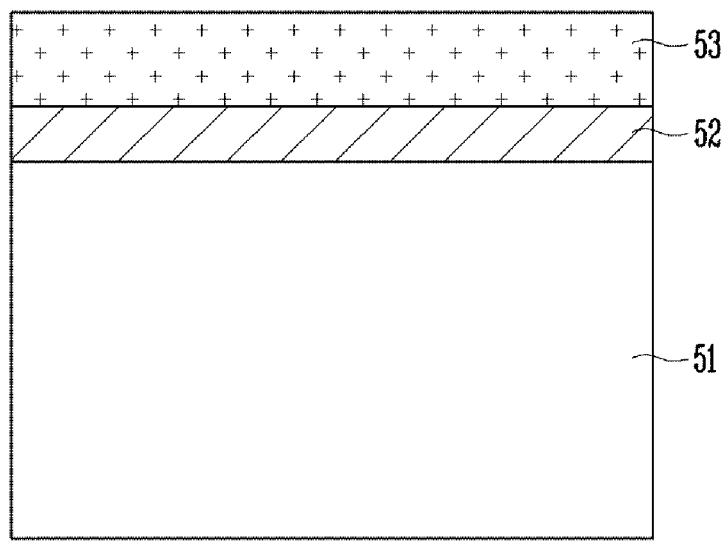
FIGS. 5A to 5C are diagrams illustrating a method for fabricating an electronic device including a semiconductor memory according to an embodiment of the present disclosure.
Figure 5B:
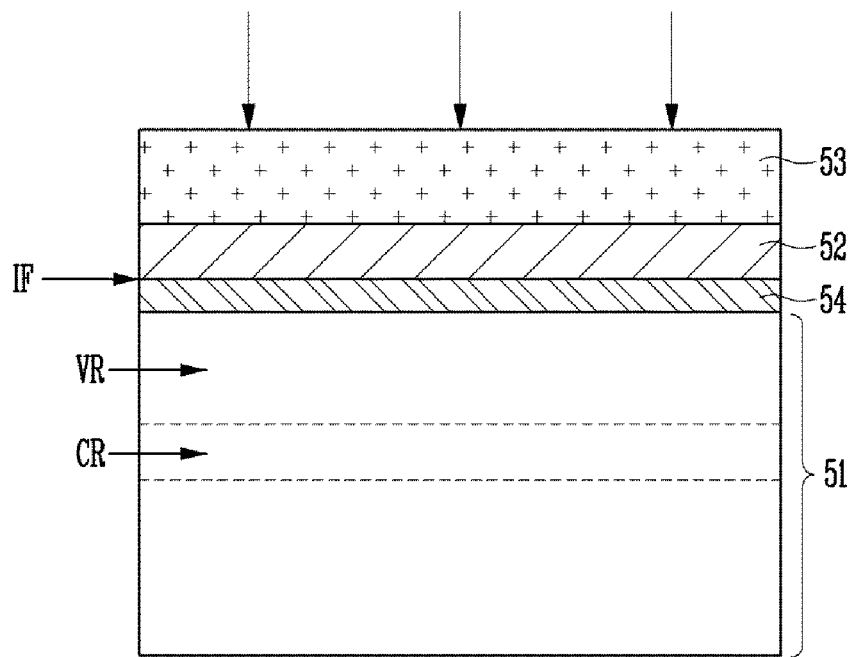
Figure 5C:
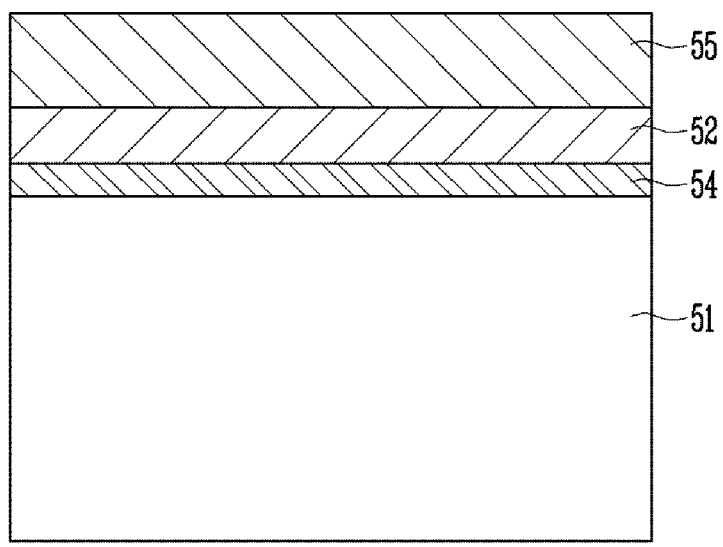

FIGS. 5A to 5C are cross-sectional diagrams illustrating the structure of an electronic device including a semiconductor memory according to an embodiment of the present disclosure. In the following description, explanation of certain elements that are discussed above is omitted for the sake of brevity.

Referring to FIG. 5A, a first conductive layer 52 may be formed on a chalcogenide layer 51. The chalcogenide layer 51 may be a variable resistance layer or a switching layer. The first conductive layer 52 may be an electrode or an interface electrode. A protective layer 53 may be formed on the first insulating conductive layer 52. The protective layer 53 may protect the first conductive layer 52 and the chalcogenide layer 51 during subsequent processes.

Referring to FIG. 5B, an interface layer 54 may be formed between the chalcogenide layer 51 and the first conductive layer 52. The interface layer 54 may be formed by irradiating or injecting ions onto the interface IF between the chalcogenide layer 51 and the first conductive layer 52. For example, ion beam mixing may be employed so that the material of the chalcogenide layer 51 and the material of the first conductive layer 52 are mixed by ions, and the density of the interface region IR may be increased, so that the interface layer 54 may be formed. For example, the content of antimony (Sb) or tellurium (Te) in the interface region IR may be higher than the content of those elements in the void region VR, or the void region VR and the core region CR. Therefore, the interface layer 54 may have a higher density than the void region VR, or a higher density than both the void region VR and the core region CR.

In addition, since the interface layer 54 having a high density is formed, a void or a defect on the interface IF may move to the void region VR of the chalcogenide layer 51. Therefore, the void region VR may have a lower density than the interface layer 54, or a lower density than both the interface layer 54 and the core region CR.

Referring to FIG. 5C, after the protective layer 53 is removed, a second conductive layer 55 may be formed on the first conductive layer 52. The first conductive layer 52 and the second conductive layer 55 may be an electrode.

By the above-described processes, by forming the interface layer 54 between the chalcogenide layer 51 and the first conductive layer 52, voids or defects on the interface IF may move into the chalcogenide layer 51. Therefore, adhesion between the chalcogenide layer 51 and the first conductive layer 52 may be improved.

Figure 6:
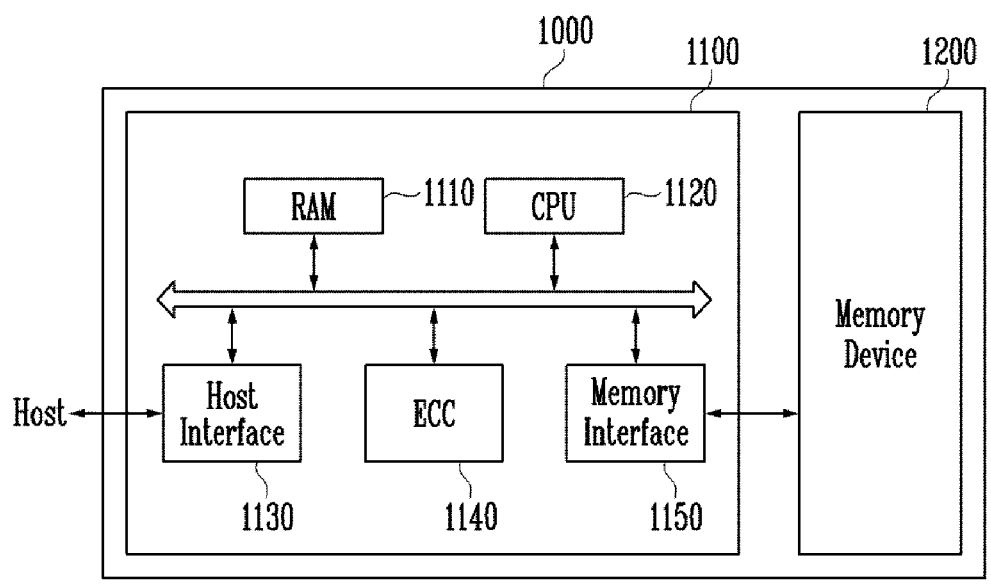
FIGS. 6 and 7 are block diagrams illustrating the configuration of a memory system according to an embodiment of the present disclosure.

FIG. 6 is a block diagram illustrating the configuration of a memory system 1000 according to an embodiment of the present disclosure.

Referring FIG. 6, a memory system 1000 according to an embodiment of the present disclosure includes a memory device 1200 and a controller 1100.

The memory device 1200 may be used to store various types of data such as text, graphic, and software code. The memory device 1200 may be a non-volatile memory device. Furthermore, the memory device 1200 may have the structure described above with reference to FIGS. 1A to 5C, and may be fabricated by the method described above with reference to FIGS. 1A to 5C. According to an embodiment, the memory device 1200 may include a variable resistance layer and an electrode on the variable resistance layer. The variable resistance layer may include an interface region adjacent to an interface between the electrode and the variable resistance layer and a void region located under the interface region. The interface region may have a higher density than the void region. Since the structure of the memory device 1200 and the fabricating method thereof are the same as those described above, a detailed description thereof will be omitted.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may serve as an operation memory of the CPU 1120, a cache memory between the memory device 1200 and the host, a buffer memory between the memory device 1200 and the host, or the like. For reference, the RAM 1110 may be replaced with a static random access memory (SRAM), a read only memory (ROM), or the like.

The CPU 1120 may control the overall operation of the controller 1100. For example, the CPU 1120 may be configured to operate firmware such as a flash translation layer (FTL) stored in the RAM 110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and the like.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be transferred from the host interface 1130 to an external device or data to be transferred from the memory interface 1150 to the memory device 1200. The controller 1100 may further include a ROM which stores code data to interface with the host.

Since the memory system 1000 according to the embodiment includes the memory device 1200 having improved integration density and characteristics, the memory system 1000 may also have improved integration density and characteristics accordingly.

Figure 7:
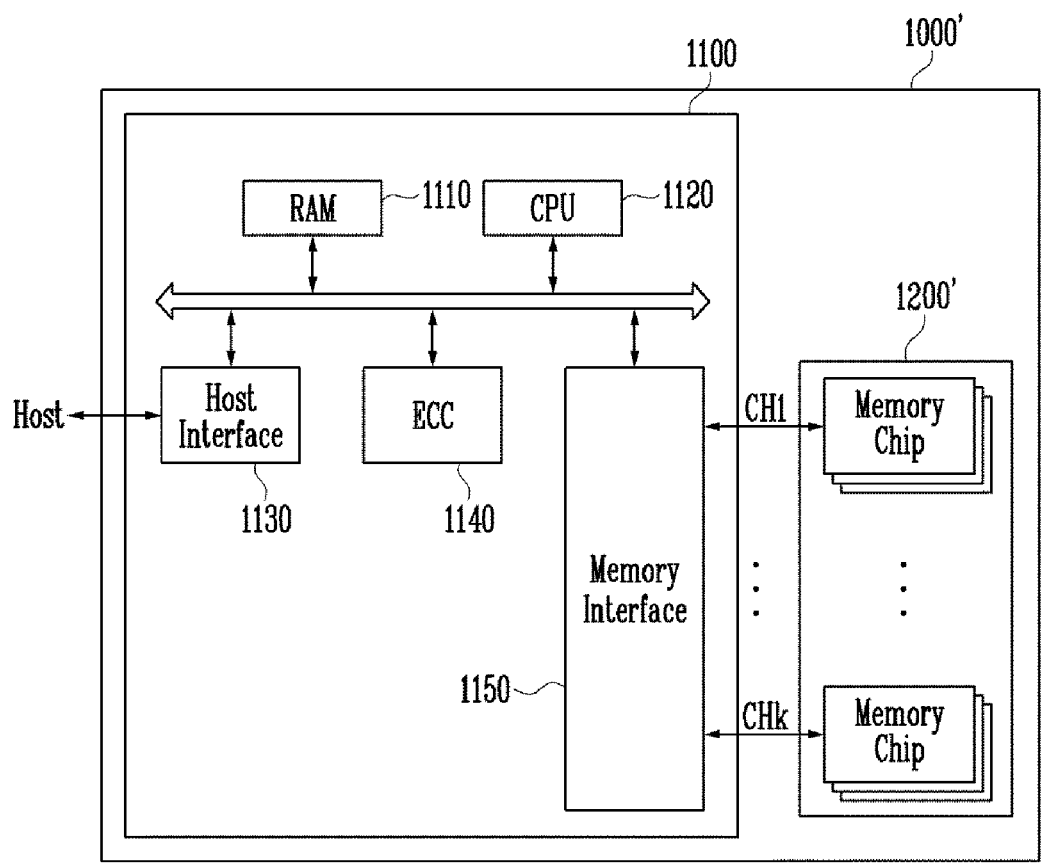

FIG. 7 is a block diagram illustrating the configuration of a memory system 1000' according to an embodiment of the present disclosure. In the following description, description of certain elements that are discussed above is omitted for the sake of brevity.

Referring to FIG. 7, the memory system 1000' according to an embodiment of the present disclosure may include a memory device 1200' and the controller 1100. The controller 1100 may include the RAM 1110, the CPU 1120, the host interface 1130, the ECC circuit 1140 and the memory interface 1150.

The memory device 1200' may be a non-volatile memory device. Furthermore, the memory device 1200' may have the structure described above with reference to FIGS. 1A to 5C, and may be fabricated by the method described above with reference to FIGS. 1A to 5C. According to an embodiment, the memory device 1200' may include a variable resistance layer and an electrode on the variable resistance layer. The variable resistance layer may include an interface region adjacent to an interface between the electrode and the variable resistance layer and a void region located under the interface region. The interface region may have a higher density than the void region. Since the memory device 1200' is configured and fabricated in the same manner as described, a detailed description thereof will be omitted.

Furthermore, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips, included in a single group, may be suitable for communicating with the controller 1100 through a common channel. The memory system 1000' may be modified so that a single memory chip may be coupled to a single channel.

Since the memory system 1000' according to the embodiment includes the memory device 1200' having improved integration and characteristics, the integration and characteristics of the memory system 1000' may also be improved. In particular, the memory device 1200' according to the present embodiment may be formed into a multi-chip package, whereby the data storage capacity and the operating speed thereof may be enhanced.

Figure 8:
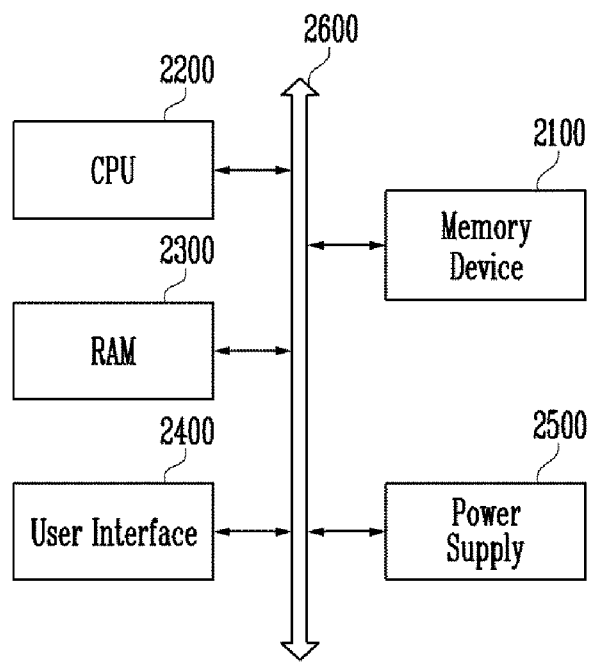
FIGS. 8 and 9 are block diagrams illustrating the configuration of a computing system according to an embodiment of the present disclosure.

FIG. 8 is a block diagram illustrating the configuration of a computing system 2000 according to an embodiment of the present disclosure. In the following description, description of certain elements that are discussed above is omitted for the sake of brevity.

As illustrated in FIG. 8, the computing system 2000 may include a memory device 2100, a CPU 2200, a random-access memory (RAM) 2300, a user interface 2400, a power supply 2500 and a system bus 2600.

The memory device 2100 may store data provided via the user interface 2400, data processed by the CPU 2200, etc. The memory device 2100 may be electrically coupled to the CPU 2200, the RAM 2300, the user interface 2400, and the power supply 2500 by the system bus 2600. For example, the memory device 2100 may be coupled to the system bus 2600 via a controller (not shown) or, alternatively, directly coupled to the system bus 2600. When the memory device 2100 is directly coupled to the system bus 2600, functions of the controller may be performed by the CPU 2200 and the RAM 2300.

The memory device 2100 may be a nonvolatile memory. Furthermore, the memory device 2100 may have the structure described above with reference to FIGS. 1A to 5C, and may be fabricated by the method described above with reference to FIGS. 1A to 5C. According to an embodiment, the memory device 2100 may include a variable resistance layer and an electrode on the variable resistance layer. The variable resistance layer may include an interface region adjacent to an interface between the electrode and the variable resistance layer and a void region located under the interface region. The interface region may have a higher density than the void region. Since the structure of the memory device 2100 and the fabricating method thereof are the same as those described above, a detailed description thereof will be omitted.

As described above with reference to FIG. 7, the memory device 2100 may be a multi-chip package configured with a plurality of memory chips.

The computing system 2000 having the above-mentioned configuration may be provided as one of various elements of an electronic device such as a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to an embodiment of the present disclosure includes the memory device 2100 having improved integration and characteristics, the characteristics of the computing system 2000 may also be improved.

Figure 9:
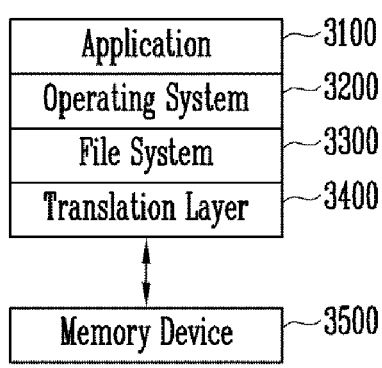

FIG. 9 is a block diagram illustrating the configuration of a computing system 3000 according to an embodiment of the present disclosure.

Referring to FIG. 9, the computing system 3000 according to an embodiment of the present disclosure may include a software layer which has an operating system 3200, an application 3100, a file system 3300, and a translation layer 3400. Furthermore, the computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 used in the computing system 3000. For example, when the operating system 3200 is a Microsoft Windows-based system, the file system 3300 may be a file allocation table (FAT) or an NT file system (NTFS). In addition, the operating system 3200 is a Unix/Linux system, the file system 3300 may be an extended file system (EXT), a Unix file system (UFS), a journaling file system (JFS), or the like.

FIG. 9 illustrates the operating system 3200, the application 3100, and the file system 3300 in separate blocks. However, the application 3100 and the file system 3300 may be included in the operating system 3200.

The translation layer 3400 may translate an address so as to be suitable for the memory device 3500 in response to a request from the file system 3300. For example, the translation layer 3400 may translate a logic address, generated by the file system 3300, into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. Furthermore, the memory device 3500 may have the structure described above with reference to FIGS. 1A to 5C, and may be fabricated by the method described above with reference to FIGS. 1A to 5C. According to an embodiment, the memory device 3500 may include a variable resistance layer and an electrode on the variable resistance layer. The variable resistance layer may include an interface region adjacent to an interface between the electrode and the variable resistance layer and a void region located under the interface region. The interface region may have a higher density than the void region. Since the structure of the memory device 3500 and the fabricating method thereof are the same as those described above, a detailed description thereof will be omitted.

The computing system 3000 having the above-described configuration may be divided into an operating system layer that is operated in an upper layer region and a controller layer that is operated in a lower layer region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the embodiment includes the memory device 3500 having improved integration and characteristics, the characteristics of the computing system 3000 may also be improved.

An electronic device and a fabricating method thereof according to the above-described embodiments of the present disclosure may improve operating characteristics and reliability of memory cells.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for fabricating an electronic device including a semiconductor memory, the method comprising:
    forming a chalcogenide layer;
    forming a first conductive layer on the chalcogenide layer;
    forming a protective layer on the first conductive layer; and
    increasing a density of an interface between the chalcogenide layer and the first conductive layer by injecting or irradiating ions onto the interface.

2. The method of claim 1, wherein in forming the first conductive layer, a void or a defect is generated in the interface, and the increased density of the interface causes the void or the defect to move into the chalcogenide layer.

3. The method of claim 1, wherein increasing the density of the interface comprises mixing a material of the chalcogenide layer with a material of the first conductive layer by injecting or irradiating ion beams onto the interface.

4. The method of claim 1, wherein increasing the density of the interface comprises migrating a high-density element from among elements included in the chalcogenide layer to the interface by injecting or irradiating ion beams onto the interface.

5. The method of claim 1, wherein increasing the density of the interface comprises migrating antimony (Sb) or tellurium (Te) included in the chalcogenide layer to the interface.

6. The method of claim 1, wherein a density of an interface region of the chalcogenide layer adjacent to the interface increases when the density of the interface increases.

7. The method of claim 1, further comprising forming the protective layer on the first conductive layer before injecting or irradiating ions into the interface.

8. The method of claim 7, wherein the protective layer includes an oxide or a nitride.

9. The method of claim 1, further comprising: removing the protective layer after injecting or irradiating the ions onto the interface; and forming a second conductive layer on the first conductive layer.

10. The method of claim 9, wherein the protective layer is removed by a cleaning process.

11. The method of claim 1, further comprising thermally treating the interface after injecting or irradiating the ions onto the interface.

12. The method of claim 1, wherein increasing the density of the interface comprises irradiating ions of at least one of germanium (Ge), arsenic (As), phosphorous (P), helium (He), boron (B), or carbon (C).

13. The method of claim 1, wherein the chalcogenide layer is a variable resistance layer or a switching layer and the first conductive layer is an electrode.

14. A method for fabricating an electronic device including a semiconductor memory, the method comprising:
    forming a chalcogenide layer;
    forming a conductive layer on the chalcogenide layer;
    forming a protective layer on the conductive layer; and
    modifying an interface between the chalcogenide layer and the conductive layer by mixing a material of the chalcogenide layer with a material of the conductive layer at the interface.

15. The method of claim 14, wherein modifying the interface comprises irradiating or injecting ion beams onto the interface.

16. The method of claim 14, wherein modifying the interface comprises:
    irradiating or injecting ion beams onto the interface; and
    thermally treating the interface.

17. The method of claim 14, wherein by modifying the interface, a density of the interface is increased, and a void or a defect on the interface moves into the chalcogenide layer.

18. A method for fabricating an electronic device including a semiconductor memory, the method comprising:
    forming a variable resistance layer;
    forming an electrode on the variable resistance layer;
    forming a protective layer on the electrode; and
    moving a void or a defect located on an interface between the variable resistance layer and the electrode into the variable resistance layer.

19. The method of claim 18, further comprising:
    increasing a density of the interface by irradiating or injecting ion beams onto the interface.

20. The method of claim 19, wherein the density of the interface is increased by mixing materials of the variable resistance layer and the electrode with each other at the interface.

* * * * *